(12) United States Patent
DeLaCruz (10) Patent No.: US 9,461,000 B2
(45) Date of Patent: Oct. 4, 2016

(54) PARALLEL SIGNAL VIA STRUCTURE

(71) Applicant: eSilicon Corporation, San Jose, CA (US)

(72) Inventor: Javier DeLaCruz, Summit, NJ (US)

(73) Assignee: eSilicon Corporation, San Jose, CA (US)

(*) Notice: Subject to any disclaimer, the term of this patent is extended or adjusted under 35 U.S.C. 154(b) by 0 days.

(21) Appl. No.: 14/283,113

(22) Filed: May 20, 2014

(65) Prior Publication Data

US 2014/0346678 A1    Nov. 27, 2014

Related U.S. Application Data

(60) Provisional application No. 61/825,986, filed on May 21, 2013.

(51) Int. Cl.
| | |
|---|---|
| *H01L 23/52* | (2006.01) |
| *H01L 23/538* | (2006.01) |
| *H01L 23/14* | (2006.01) |
| *H01L 23/50* | (2006.01) |

(52) U.S. Cl.
CPC ......... *H01L 23/5384* (2013.01); *H01L 23/147* (2013.01); *H01L 23/50* (2013.01); *H01L 23/5386* (2013.01); *H01L 2224/16145* (2013.01); *H01L 2224/16225* (2013.01); *H01L 2924/15311* (2013.01)

(58) Field of Classification Search
CPC .......... H01L 2224/05093; H01L 2224/05096
USPC .......... 257/774, 775, 784, E23.02, E23.144; 438/667
See application file for complete search history.

(56) References Cited

U.S. PATENT DOCUMENTS

| | | | | |
|---|---|---|---|---|
| 6,365,978 | B1* | 4/2002 | Ibnabdeljalil et al. | ........ 257/786 |
| 6,448,641 | B2* | 9/2002 | Ker et al. | ........ 257/700 |
| 8,237,274 | B1* | 8/2012 | Rahman | ........ 257/737 |
| 2002/0158334 | A1* | 10/2002 | Vu et al. | ........ 257/723 |
| 2003/0155642 | A1* | 8/2003 | Davis et al. | ........ 257/700 |

\* cited by examiner

*Primary Examiner* — John C Ingham
(74) *Attorney, Agent, or Firm* — Fenwick & West LLP (57) ABSTRACT

A silicon interposer with redundant thru-silicon vias. The silicon interposer includes a first trace structure on a first side of the interposer and a second trace structure on a second side of the interposer. The silicon interposer also includes at least two redundant thru-silicon vias connecting the first trace structure to the second trace structure.

20 Claims, 6 Drawing Sheets

PARALLEL SIGNAL VIA STRUCTURE

CROSS REFERENCE TO RELATED APPLICATIONS

This application claims the benefit of U.S. Provisional Application No. 61/825,986, filed May 21, 2013, which is incorporated by reference in its entirety.

BACKGROUND OF THE INVENTION

1. Field of the Invention

This invention relates to thru-silicon vias.

2. Description of the Related Art

Thru-silicon vias (TSVs) are used in three dimensional (3D) and 2.5D integrated circuits (collectively, 3DICs) to route signals from the top of a die, to the bottom of the die. As the size of TSVs decrease, their reliability also decreases. For example, as the diameter of TSVs decrease, they are more prone to effects such as electromigration, which can potentially create open circuits in the TSVs.

Thus, there is a need for improving the reliability of TSVs to increase the life time of 3DICs.

SUMMARY OF THE INVENTION

The present invention overcomes the limitations of the prior art by including a set of redundant thru-silicon vias (TSVs) to route a signal. If one TSV fails (e.g., due to electromigration), the other redundant TSVs will still route the signal to the desired location. In some embodiments, the redundant TSVs are designed in a manner that reduces any difference in propagation delay between signal paths through different TSVs.

Other aspects include components, devices, systems, improvements, methods, processes, applications and other technologies related to the foregoing.

BRIEF DESCRIPTION OF THE DRAWINGS

The invention has other advantages and features which will be more readily apparent from the following detailed description of the invention and the appended claims, when taken in conjunction with the accompanying drawings, in which:

DETAILED DESCRIPTION OF THE PREFERRED EMBODIMENTS

Figure 1A:
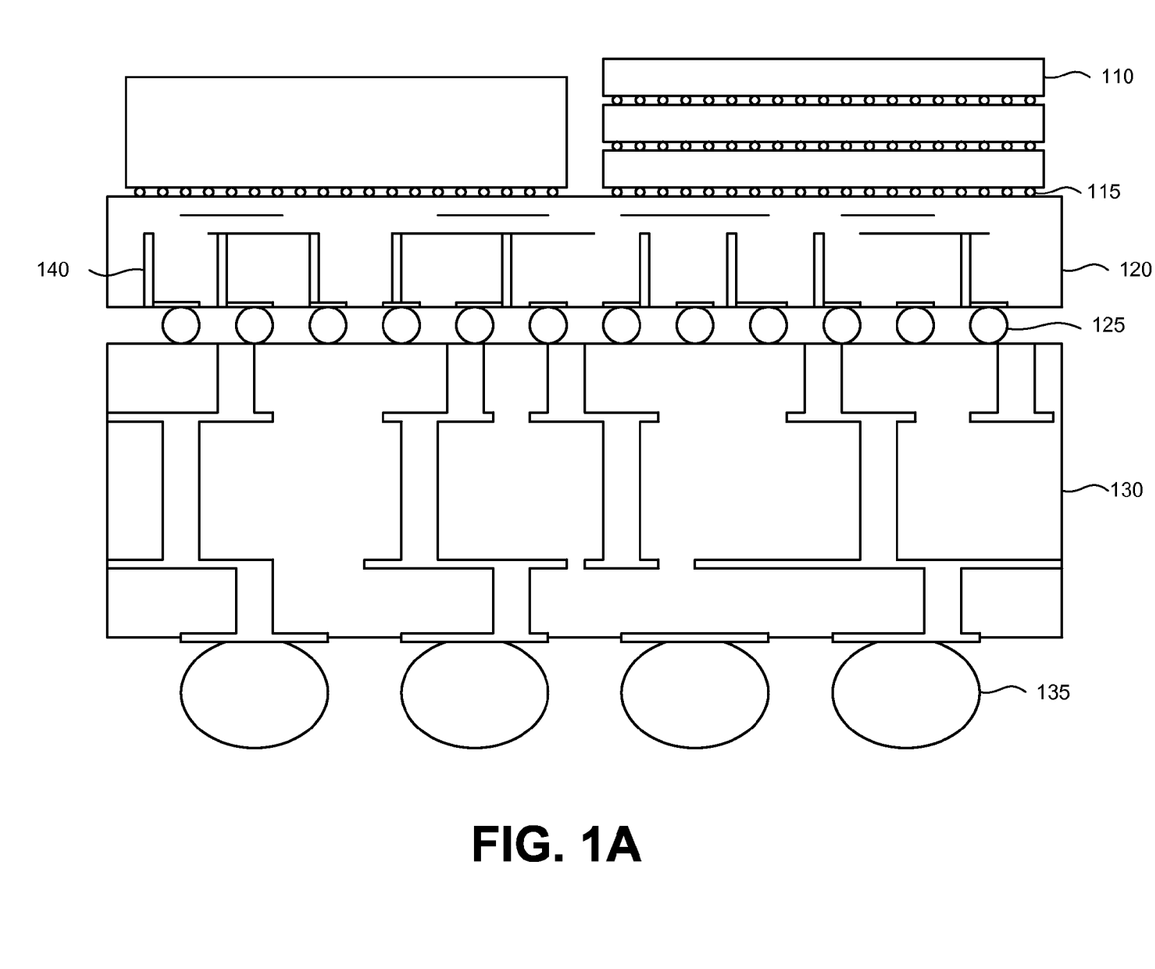
FIG. 1A is a cross sectional side view of a three dimensional integrated circuit (3DIC), according to one embodiment of the invention.

FIG. 1A is a cross sectional side view of a three dimensional (3D) and 2.5D integrated circuit (3DIC). A 3DIC typically includes a stack of alternating active chips and silicon interposers. As shown in FIG. 1, an exemplary 3DIC may include several tiles 110 (e.g., logic, field programmable gate arrays or FPGA, memory-stacks, integrated passive devices or IPD, etc), a passive silicon interposer 120 and an organic laminate 130. In order to route signals, one or more of these components may include thru-silicon vias (TSV).

Figure 1B:
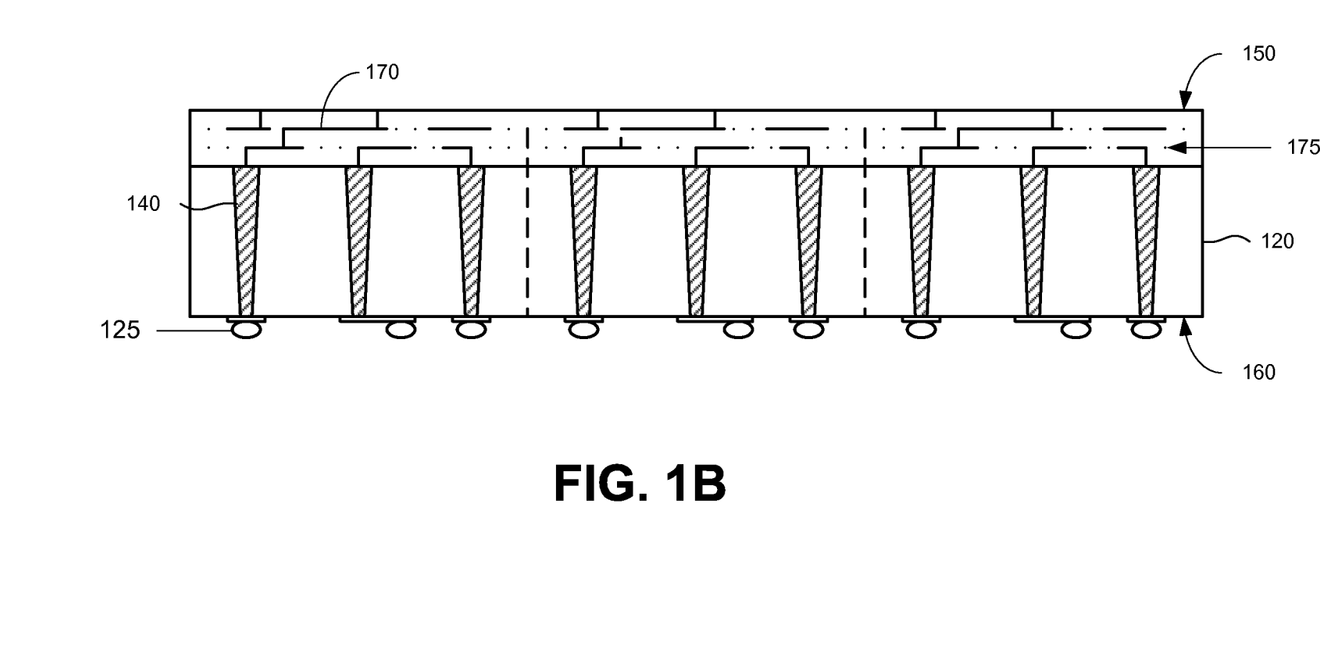
FIG. 1B is a cross sectional side view of a silicon interposer, according to one embodiment of the invention.

FIG. 1B is a cross sectional side view of a silicon interposer 120, according to one embodiment of the invention. Silicon interposer 120 may route signals from a one side 150 of the interposer to the other side 160 of the interposer. For instance, the first side 150 may be used to interface to an integrated circuit, and the second side 160 may be used to interface to an organic laminate or a printed circuit board. Silicon interposer 120 may also route signals from one location on one side 150/160 to another location on the same side 150/160, for example routing signals from one integrated circuit to another integrated circuit.

In some embodiments, one side 150 of the interposer has trace structures with a finer pitch than those on the other side 160. For instance, the first side 150 of the interposer 120 may interface to an integrated circuit with a contact-to-contact pitch of 40 μm and the second side 160 of the interposer 120 may interface to an organic laminate with a contact-to-contact pitch of 225 μm.

In some embodiments, at least one side of the interposer has multiple layers 175 of metal traces 170 that are used as interconnects. For instance, silicon interposer 120 of FIG. 1B has three layers 175 of metal interconnects 170. Other silicon interposers may have a different number of metal interconnect layers 175 (e.g., 9 metal interconnect layers). In one embodiment, only the side with the finer pitch has multiple layers of metal interconnects. In another embodiment, both sides of the silicon interposer may have multiple layers of metal interconnects.

A thru-silicon via or TSV 140 is an electrical interconnect that passes from a trace on one side 150 of a silicon wafer or die (or other tile or component) to a trace on the other side 160. TSVs may route signals from one side of the die (e.g., top side of the die) to the other side of the die (e.g., bottom side of the die).

To create an electrical connection between the components of the 3DIC (e.g., tiles 110, interposer, etc), each component may include solder balls. Depending on the type of component or technology used to design the component, the solder balls can be microbumps 115, bumps 125, or balls 135, as shown in FIG. 1A. For example, tiles 110 may use microbumps 115 to create electrical connections between each other and with the silicon interposer 120. The silicon interposer 120 may use bumps 125 to create electrical connections with the organic laminate 130. The organic laminate may then use balls 135 to create electrical connection with an external circuitry.

To increase the ease and yield of manufacturing 3DICs, integrated circuit fabrication facilities often limit the flexibility in the design of TSVs. For example, a fab may specify that the TSVs present in a silicon interposer can only have a certain diameter. In this case, silicon interposer designers can only choose the placement of the TSV.

As 3DIC technology evolves, TSVs typically become smaller. Smaller TSVs allows designers to incorporate a larger number of TSVs in a silicon interposer. Further, the reliability of TSVs may also decrease as their size decreases. For example, as the diameter of TSVs decrease, TSVs might become more prone to effects such as electromigration. As a result, smaller diameter TSVs may fail more easily than larger diameter TSVs.

To increase the reliability and lifetime of a 3DIC, redundant TSVs can be used to route signals, as shown in FIGS. 3A-3E. For example, redundant TSVs may be used to route data signals. As used herein, a data signal is an electrical signal that has different values based on the information the data signal is transmitting. The electrical signal may, for example, be a voltage signal. For instance, a digital data signal may have a first voltage value (e.g., 0V) when the information being transmitted is a bit with a value of 0 and may have a second voltage value (e.g., 1V or VDD) when the information being transmitted is a bit with a value of 1.

If one TSV routing a signal fails, the signal would still be routed to the desired location through the redundant TSVs. In some embodiments, the number and/or arrangement of redundant TSVs is based on the signal carried. For example, a larger number of redundant TSVs may be used to carry a power supply, in order to handle the larger current and to effect efficient distribution. A lower number of redundant TSVs may be used to carry a data signal along a non-critical, point-to-point connection.

The signal traveling from one side of an interposer to the other side of the interposer may degrade if the propagation delay along signal paths through each of the redundant vias is different.

Figure 2A:
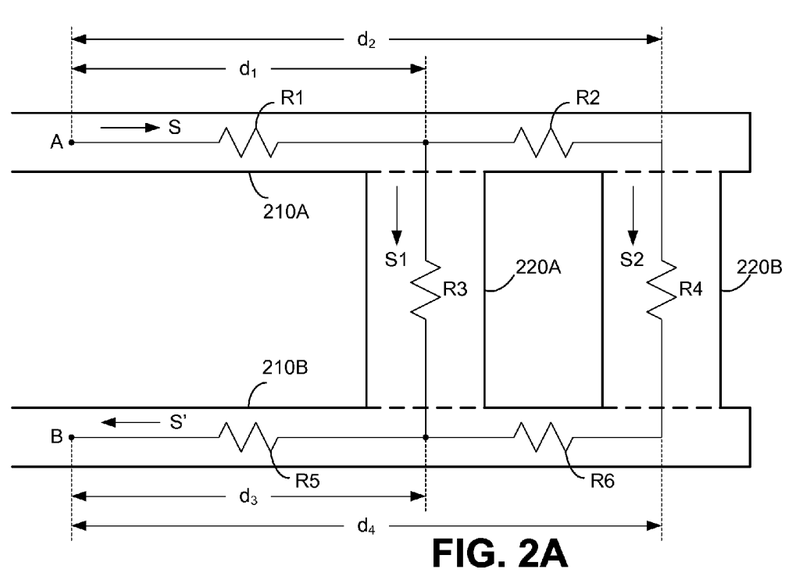
FIG. 2A is a cross sectional view of a silicon interposer with two redundant vias without propagation delay matching, according to one embodiment of the invention.

FIG. 2A illustrates a circuit diagram of an interposer with two redundant vias with different propagation delays, according to one embodiment. The interposer of FIG. 2A includes a first trace structure 210A on a first side of the interposer and a second trace structure 210B on a second side of the interposer. Trace structure 210A and trace structure 210B are connected to each other by the two redundant TSVs 220A, 220B. Therefore, a signal that propagates from point A on trace structure 210A to point B on trace structure 210B can travel along two signal paths: one signal path from the first trace structure 210A through the first TSV 220A to the second trace 210B, and a second signal path from the first trace structure 210A through the second TSV 220B to the second trace structure 210B. For convenience, points A and B may be referred to as common points since they are common to both signal paths.

A signal traveling from common point A to common point B, through the first TSV 220A, may see a resistance of $R_{TSV1}=R1+R3+R5$. A signal traveling from common point A to common point B, through the second TSV 220B, may see a resistance of $R_{TSV2}=R1+R2+R4+R6+R5$. The first signal path has a lower resistance and a shorter length than the second signal path. Therefore, the propagation delay along the first signal path is lower than the propagation delay along the second signal path.

Figure 2B:
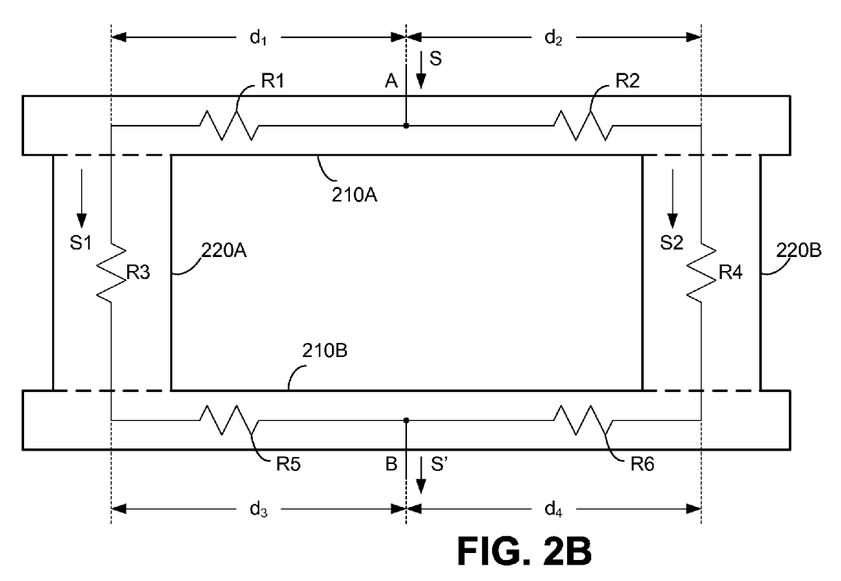
FIG. 2B is a cross sectional view of a silicon interposer with two redundant vias with propagation delay matching, according to one embodiment.

FIG. 2B illustrates a circuit diagram of an interposer with two redundant vias with matching propagation delays, according to one embodiment. In the interposer of FIG. 2B, the common points A and B are mid-way between the two interposers. That is the signal S enters the trace structure 210A at common point A (from a branch that is not shown in FIG. 2B) and the signal S' exits the trace structure 210B at common point B (along another branch that is not shown in FIG. 2B). A first portion S1 of the signal S traveling from node A to node B through the first TSV 220A may see a resistance of $R_{TSV1}=R1+R3+R5$. The second portion S2 of the signal traveling from node A to node B though the second TSV 220B may see a resistance of $R_{TSV2}=R2+R4+R6$. If the distance $d_1$ from node A to the first TSV 220A is substantially equal to the distance $d_2$ from node A to TSV 220B, and distance $d_3$ from the first TSV 220A to node B is substantially equal to the distance $d_4$ from the second TSV 220B to node B, then $R_{TSV1}$ would be substantially equal to $R_{TSV2}$. Therefore, the propagation delay along the S1 signal path from node A to node B is substantially equal to the propagation delay along the S2 signal path from node A to node B. Note that in this example, the lengths of the signal paths (and the corresponding propagation delays) along each trace structure 210A,B is substantially equal. That is, the propagation delay from common node A to TSV 220A is substantially equal to the propagation delay from common node A to TSV 220B. Similarly, the propagation delay from TSV 220A to common node B is substantially equal to the propagation delay from TSV 220B to common node B.

Figure 2C:
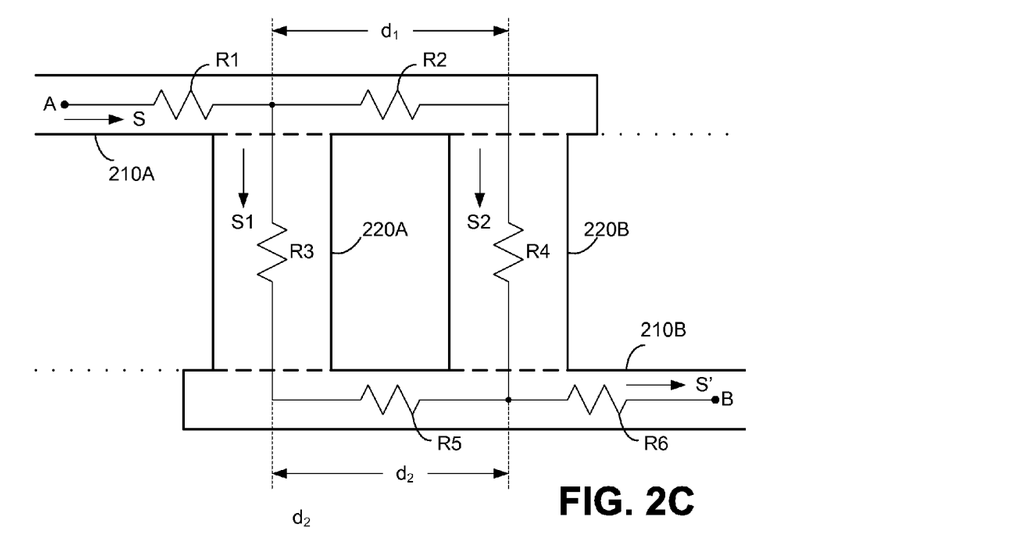
FIG. 2C is a cross sectional view of a silicon interposer with two redundant vias with propagation delay matching, according to one embodiment.

FIG. 2C illustrates a circuit diagram of an interposer with two redundant vias with matching propagation delays, according to one embodiment of the invention. In the interposer of FIG. 2C, the first portion S1 of the signal S traveling from node A to node B through the first TSV 220A may see a resistance of $R_{TSV1}=R1+R3+R5+R6$. The second portion S2 of the signal traveling from node A to node B though the second TSV 220B may see a resistance of $R_{TSV2}=R1+R2+R4+R6$. If the resistance R2 between the first TSV 220A and the second TSV 220B on the first side 150 of the interposer 120, and the resistance R5 between the first TSV 220A and the second TSV 220B on the second side 160 of the interposer 120 are substantially equal, then $R_{TSV1}$ and $R_{TSV2}$ would also be substantially equal. In some embodiments, R2 and R5 are substantially matched by connecting the first TSV 220A and the second TSV 220B with traces of substantially equal shape and size on both the first side 150 and the second side 160 of the interposer 120. Unlike FIG. 2B, in FIG. 2C the propagation delays along each individual trace structure 210A,B are not matched but the overall propagation delay is matched.

Figure 2D:
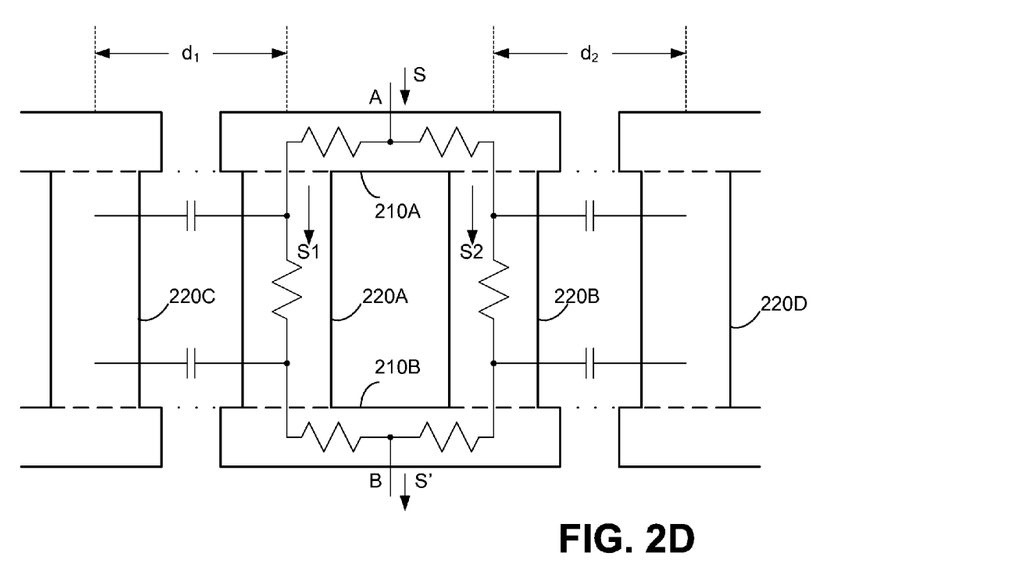
FIG. 2D is a cross sectional view of a silicon interposer with two redundant vias with matching parasitics, according to one embodiment.

In some embodiments, structures surrounding the TSVs 140 and structures surrounding the metal interconnect traces connecting the redundant vias to each other are designed to substantially match the parasitic capacitances of each of the redundant TSVs. FIG. 2D illustrates a cross section with a circuit diagram of an interposer with two redundant vias with matched propagation delays, according to one embodiment of the invention. In the example of FIG. 2D, the parasitic capacitance between TSV 220A and TSV 220C is substantially matched to the parasitic capacitance between TSV 220B and TSV 220D. In some embodiments, the parasitic capacitance between TSV 220A and TSV 220C is substantially matched to the parasitic capacitance between TSV 220B and TSV 220D by substantially matching the distance $d_1$ between TSV 220A and TSV 220C, and the distance $d_2$ between TSV 220B and TSV 220D. In some embodiments, TSV 220C and TSV 220D carry the same signal. For instance, TSV 220C and TSV 220D may carry a supply voltage or ground (e.g., VDD or VSS).

FIGS. 3A-3E show top views of different configurations of redundant TSVs. In these figures, the redundant TSVs are shown as cross-hatched circles. FIGS. 3A-3E show only one of the trace structures. In many cases, the other trace structure (i.e., the trace structure on the other side of the interposer) will have a same shape, at least for the portion of the trace structure that connects to the thru-silicon vias. In addition, the portion of the trace structure connecting to the thru-silicon vias may also be surrounded by a separate trace structure carrying power or ground, to provide some isolation.

Figure 3A:
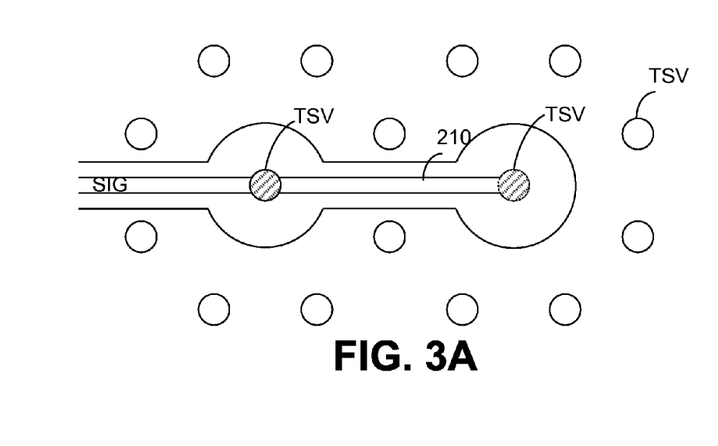
FIG. 3A is a top view of a redundant via structure with a straight metal trace, according to one embodiment of the invention.

FIG. 3A shows a signal (SIG) that is routed by a trace structure that connects to two redundant TSVs. The TSVs are connected by a straight metal trace 210. FIG. 3A also shows other TSVs that carry other signals.

Figure 3B:
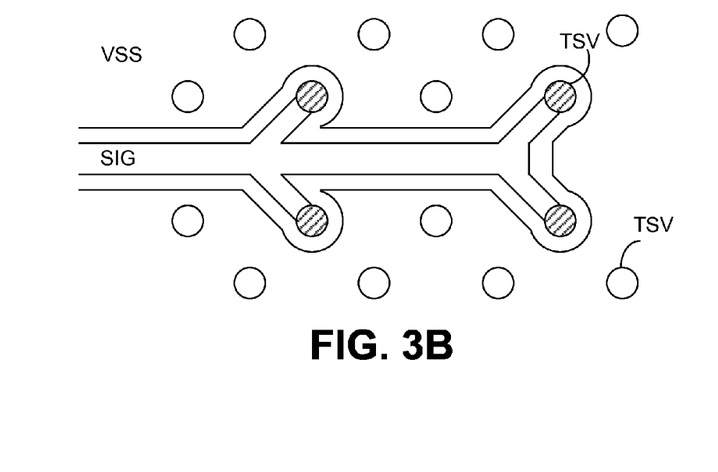
FIG. 3B is a top view of a redundant via structure connected in a tree-like structure, according to one embodiment of the invention.

In FIG. 3B, the trace structure carrying the signal (SIG) connects to four redundant TSVs using a tree configuration (i.e., traces connecting to the TSVs branch off a main trunk of the trace structure). The remaining TSVs shown in FIG. 3B (the clear circles) provide redundancy for a separate trace structure carrying VSS, thus providing some shielding to the SIG trace structure. The trace structure shown may be configured in a manner to reduce the propagation delay difference of a signal to different TSVs. This increases the speed of the signals that can be sent through the redundant TSV structures.

For example, in the trace structure shown in FIG. 3B, the TSVs can be located so that the propagation delay to each TSV is approximately the same, similar to a clock distribution tree. One way to do this is to provide approximately the same length of metal trace from a common point to each TSV. In another approach, as shown in FIG. 3F, the delay for the overall signal path from signal source to signal destination through each TSV is designed to be approximately the same, even though the delay from source to TSV (or from TSV to destination) may differ. In other words, the total path includes both the trace structure 210A on the side of the interposer, in addition to the trace structure 210B on the reverse side of the interposer. So a shorter trace on one side may be compensated for by a longer trace on the reverse side.

Figure 3C:
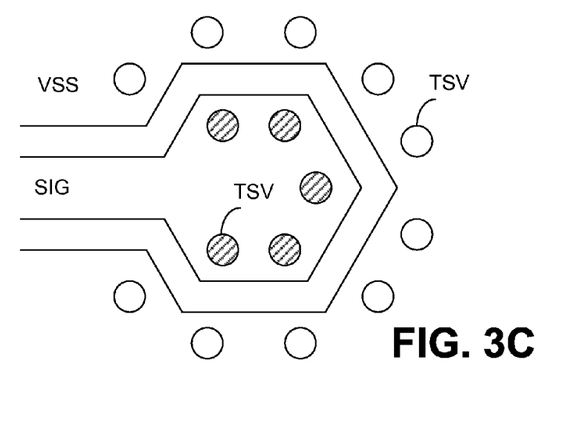
FIG. 3C is a top view of a redundant via structure with a metal interconnect shaped as a hexagon, according to one embodiment of the invention.

In FIG. 3C, the trace structure carrying the signal (SIG) has a hexagon shape where it connects to five redundant TSVs. One advantage of this approach is that the propagation delay to each TSV is approximately equal. Again, the other TSVs in FIG. 3C provide redundancy for a separate trace structure carrying VSS. In the structure shown in FIG. 3C, the trace structure carrying SIG terminates in a large metal island shaped as a hexagon, and each TSV connects to the hexagon island approximately at a vertex of the hexagon. This large metal island reduces the difference in propagation delay for TSVs located at different distances from the metal trace feeding the island. Other equilateral polygons may also be used.

Figure 3D:
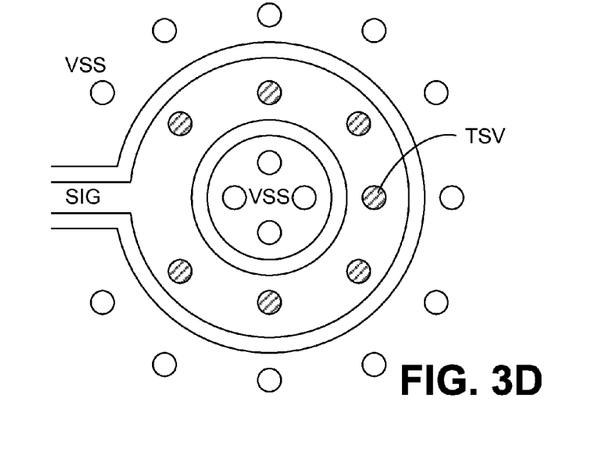
FIG. 3D is a top view of a redundant via structure with a metal interconnect shaped as a circular annulus, according to one embodiment of the invention.

In FIG. 3D, the trace structure carrying the signal (SIG) terminates in a circular annulus, which connects to seven redundant TSVs. The structure of FIG. 3D also shows the signal (SIG) TSVs surrounded by supply (VSS) TSVs. This may provide some shielding for the signal.

Figure 3E:
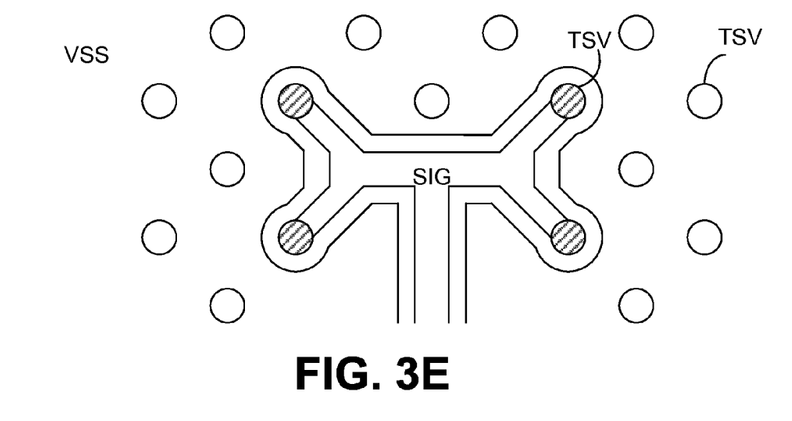
FIG. 3E is a top view of a redundant via structure connected in an H-tree structure, according to one embodiment of the invention.
Figure 3F:
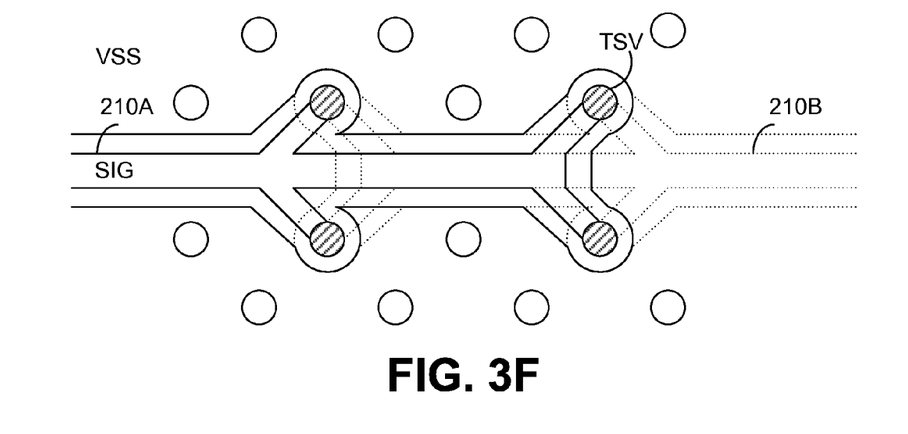
FIG. 3F is a top view of a redundant via structure connected in a tree-like structure, according to one embodiment of the invention.

In FIG. 3E, the trace structure carrying the signal (SIG) uses an H-tree configuration. If a balanced H-tree is used, then the signal path to each of the TSVs is substantially equal. The TSVs surrounding the H-tree structure may route a supply voltage (VSS). This may provide some shielding to the signal, as well as provide a parasitic capacitance matching for the TSVs carrying the signal (SIG).

In some embodiments, the structure used depends on the type of signal being routed through the TSVs. For example, power supply signals may not require propagation delay matching, thus allowing for any structure to be used to route those signals; whereas a high speed signal may need a high degree of propagation delay matching, thus requiring the use of more complex structures (e.g., structure of FIG. 3D).

In some embodiments, the redundant TSV structures are saved in a library from which designers can pick and choose the appropriate structure. In one embodiment, a designer may design a different structure based on the signal requirements. In other embodiments, a computer implemented program may generate a pattern of redundant TSVs based on the space available for TSVs and the requirements of the signals to be routed through the TSVs.

It should be understood that the present invention is not limited to silicon interposers or other silicon die, but it might be applied to any application where redundant vias are advantageous (e.g., organic interposers, etc.).

Although the detailed description contains many specifics, these should not be construed as limiting the scope of the invention but merely as illustrating different examples and aspects of the invention. It should be appreciated that the scope of the invention includes other embodiments not discussed in detail above. Various modifications, changes and variations which will be apparent to those skilled in the art may be made in the arrangement, operation and details of the method and apparatus of the present invention disclosed herein without departing from the spirit and scope of the invention as defined in the appended claims. Therefore, the scope of the invention should be determined by the appended claims and their legal equivalents. Furthermore, no element, component or method step is intended to be dedicated to the public regardless of whether the element, component or method step is explicitly recited in the claims.

In the claims, reference to an element in the singular is not intended to mean "one and only one" unless explicitly stated, but rather is meant to mean "one or more." In addition, it is not necessary for a device or method to address every problem that is solvable by different embodiments of the invention in order to be encompassed by the claims.

What is claimed is:

1. A silicon interposer comprising:
    a first surface on a first side of the silicon interposer and a second surface on a second side of the silicon interposer, opposite to the first side;
    a first trace structure located on the first surface of the silicon interposer;
    a second trace structure located on the second surface of the silicon interposer; and
    at least two redundant thru-silicon vias connecting the first trace structure to the second trace structure, wherein a propagation delay for a signal propagating along a first signal path is substantially equal to a propagation delay for the signal propagating along a second signal path, wherein the first signal path is from a first common point on the first trace structure located on the first surface of the silicon interposer through a first one of the redundant thru-silicon vias to a second common point on the second trace structure located on the second surface of the silicon interposer, and the second signal path is from the first common point on the first trace structure located on the first surface of the silicon interposer through a second one of the redundant thru-silicon vias to the second common point on the second trace structure located on the second surface of the silicon interposer.

2. The silicon interposer of claim 1, wherein the first trace structure and the second trace structure are for routing a data signal, the data signal transitioning from a first value to a second value based on the information being transmitted by the data signal.

3. The silicon interposer of claim 1, wherein a length of the first signal path from the first common point on the first trace structure to the first redundant thru-silicon via is substantially equal to a length of the second signal path from the first common point on the first trace structure to the second redundant thru-silicon via.

4. The silicon interposer of claim 1, wherein a length of the first signal path from the first redundant thru-silicon via to the second common point on the second trace structure is substantially equal to a length of the second signal path from the second redundant thru-silicon via to the second common point on the second trace structure.

5. The silicon interposer of claim 1, wherein a length of the first signal path is substantially equal to a length of the second signal path.

6. The silicon interposer of claim 1, wherein a length of every signal path from the first common point on the first trace structure through any of the redundant thru-silicon vias to the second common point on the second trace structure is substantially equal.

7. The silicon interposer of claim 1, wherein a parasitic capacitance of the first thru-silicon via and a parasitic capacitance of the second thru-silicon via are substantially equal.

8. The silicon interposer of claim 1, wherein at least one of the trace structures connects to the redundant thru-silicon vias using a tree structure, the tree structure having a main trunk and a plurality of branches connected to the main trunk, wherein each of the redundant thru-silicon vias is connected to a branch of the tree structure.

9. The silicon interposer of claim 1, wherein at least one of the trace structures terminates in a circular annulus, and the redundant thru-silicon vias are connected to the circular annulus.

10. The silicon interposer of claim 9, further comprising a separate trace structure located in a center of the circular annulus, the separate trace structured connected to power or ground.

11. The silicon interposer of claim 1, wherein at least one of the trace structures terminates in an island shaped as an equilateral polygon, and the redundant thru-silicon vias are connected to the island.

12. The silicon interposer of claim 11, wherein the thru-silicon vias connect to the island at vertices of the equilateral polygon.

13. The silicon interposer of claim 1, wherein at least one of the trace structures connects to the redundant thru-silicon vias using an H-tree structure, the H-tree structure having a main trunk branching off in an H-tree topology to end nodes of the H-tree structure, wherein each of the redundant thru-silicon vias is connected to one of the end nodes of the H-tree structure.

14. The silicon interposer of claim 13, wherein the H-tree structure is a balanced H-tree structure.

15. The silicon interposer of claim 1, wherein a portion of the first trace structure connecting to the redundant thru-silicon vias has a same shape as a portion of the second trace structure connecting to the redundant thru-silicon vias.

16. The silicon interposer of claim 1, further comprising a third trace structure surrounding a portion of the first trace structure connecting to the redundant thru-silicon vias, wherein the first trace structure carries signal and the third trace structure carries power or ground.

17. The silicon interposer of claim 1, further comprising redundant thru-silicon vias connecting to the third trace structure.

18. The silicon interposer of claim 1, wherein:
the first trace structure and the second trace structure include a first portion connecting the at least two redundant thru-silicon vias to each other, and a second portion connected to the first portion; and
the first signal path and the second signal path are from the second portion of the first trace to the second portion of the second trace.

19. The silicon interposer of claim 1, wherein the first signal path and the second signal paths are from the first side of the silicon interposer to the second side of the silicon interposer.

20. The silicon interposer of claim 1, wherein the first common point on the first trace structure located on the first surface of the silicon interposer is a first contact pad configured to interface a first external component, and the second common point on the second trace structure located on the second surface of the silicon interposer is a second contact pad configured to interface a second external component.

* * * * *